(12) United States Patent
Clifton et al.

(10) Patent No.: US 12,402,365 B2
(45) Date of Patent: *Aug. 26, 2025

(54) SOI WAFERS AND DEVICES WITH BURIED STRESSORS

(71) Applicant: Acorn Semi, LLC, Palo Alto, CA (US)

(72) Inventors: Paul A. Clifton, Palo Alto, CA (US); Andreas Goebel, Mountain View, CA (US)

(73) Assignee: Acorn Semi, LLC, Palo Alto, CA (US)

( * ) Notice: Subject to any disclaimer, the term of this patent is extended or adjusted under 35 U.S.C. 154(b) by 38 days.

This patent is subject to a terminal disclaimer.

(21) Appl. No.: 18/465,050

(22) Filed: Sep. 11, 2023

(65) Prior Publication Data

US 2024/0006532 A1   Jan. 4, 2024

Related U.S. Application Data

(60) Continuation of application No. 17/657,854, filed on Apr. 4, 2022, now Pat. No. 11,791,411, which is a
(Continued)

(51) Int. Cl.
*H10D 30/69* (2025.01)
*H01L 21/02* (2006.01)
(Continued)

(52) U.S. Cl.
CPC ..... *H10D 30/798* (2025.01); *H01L 21/02381* (2013.01); *H01L 21/02532* (2013.01);
(Continued)

(58) Field of Classification Search
CPC ......... H01L 21/02381; H01L 21/02532; H01L 21/76254; H01L 21/76283; H01L 27/1203;
(Continued)

(56) References Cited

U.S. PATENT DOCUMENTS

| | | |
|---|---|---|
| 4,994,866 A | 2/1991 | Awano |
| 5,155,571 A | 10/1992 | Wang et al. |
| | (Continued) | |

FOREIGN PATENT DOCUMENTS

| | | |
|---|---|---|
| DE | 102008061152 A1 | 6/2010 |
| EP | 0123163 A2 | 10/1984 |
| | (Continued) | |

OTHER PUBLICATIONS

Arghavani; et al., "A Reliable and Manufacturable Method to Induce a Stress of >1 GPa on a P-Channel MOSFET in High vol. Manufacturing" Santa Clarita, California 95054, IEEE Electron Device Letters, vol. 27, No. 2, Feb. 2006, pp. 114-116.
(Continued)

*Primary Examiner* — Matthew E Warren
(74) *Attorney, Agent, or Firm* — Ascenda Law Group, PC

(57) ABSTRACT

A semiconductor structure includes a layer arrangement consisting of, in sequence, a semiconductor-on-insulator layer (SOI) over a buried oxide (BOX) layer over a buried stressor (BS) layer with a silicon bonding layer (BL) intervening between the BOX and the BS layers. The semiconductor structure may be created by forming the BS layer on a substrate of a first wafer; growing the BL layer at the surface of the BS layer; wafer bonding the first wafer to a second wafer having a silicon oxide layer formed on a silicon substrate such that the silicon oxide layer of the second wafer is bonded to the BL layer of the first wafer, and thereafter removing a portion of the silicon substrate of the second wafer.

29 Claims, 8 Drawing Sheets

Related U.S. Application Data continuation of application No. 17/089,429, filed on Nov. 4, 2020, now Pat. No. 11,322,615, which is a continuation of application No. 16/283,578, filed on Feb. 22, 2019, now Pat. No. 10,833,194, which is a continuation of application No. 15/655,710, filed on Jul. 20, 2017, now abandoned, which is a continuation-in-part of application No. 15/594,436, filed on May 12, 2017, now Pat. No. 10,084,091, which is a continuation of application No. 15/191,369, filed on Jun. 23, 2016, now Pat. No. 9,673,327, which is a division of application No. 13/762,677, filed on Feb. 8, 2013, now Pat. No. 9,406,798, which is a continuation of application No. 12/869,978, filed on Aug. 27, 2010, now Pat. No. 8,395,213.

(60) Provisional application No. 62/364,801, filed on Jul. 20, 2016.

(51) Int. Cl.
| | | |
|---|---|---|
| *H01L 21/762* | (2006.01) | |
| *H10D 62/10* | (2025.01) | |
| *H10D 62/17* | (2025.01) | |
| *H10D 86/00* | (2025.01) | |

(52) U.S. Cl.
CPC .. *H01L 21/76254* (2013.01); *H01L 21/76283* (2013.01); *H10D 30/751* (2025.01); *H10D 30/792* (2025.01); *H10D 30/795* (2025.01); *H10D 30/797* (2025.01); *H10D 62/115* (2025.01); *H10D 62/314* (2025.01); *H10D 86/201* (2025.01)

(58) Field of Classification Search
CPC ............... H01L 29/0649; H01L 29/105; H01L 29/1054; H01L 29/7843; H01L 29/7846; H01L 29/7848; H01L 29/7849; H10D 30/751; H10D 30/792; H10D 30/795; H10D 30/797; H10D 30/798; H10D 62/115; H10D 62/314; H10D 86/201
See application file for complete search history.

(56) References Cited

U.S. PATENT DOCUMENTS

| | | | |
|---|---|---|---|
| 5,503,704 | A | 4/1996 | Bower et al. |
| 5,904,860 | A | 5/1999 | Nagakubo et al. |
| 6,406,973 | B1 | 6/2002 | Lee |
| 6,492,216 | B1 | 12/2002 | Yeo et al. |
| 6,498,359 | B2 | 12/2002 | Schmidt et al. |
| 6,583,437 | B2 | 6/2003 | Mizuno et al. |
| 6,600,170 | B1 | 7/2003 | Xiang |
| 6,690,043 | B1 | 2/2004 | Usuda et al. |
| 6,707,106 | B1 | 3/2004 | Wristers et al. |
| 6,724,088 | B1 | 4/2004 | Jammy et al. |
| 6,881,635 | B1 | 4/2005 | Chidambarrao et al. |
| 6,927,138 | B2 | 8/2005 | Takenaka |
| 7,019,326 | B2 | 3/2006 | Cea et al. |
| 7,138,310 | B2 | 11/2006 | Currie et al. |
| 7,202,513 | B1 | 4/2007 | Chidambarrao et al. |
| 7,338,834 | B2 | 3/2008 | Clifton |
| 7,388,278 | B2 | 6/2008 | Holt et al. |
| 7,524,740 | B1 | 4/2009 | Liu et al. |
| 7,534,701 | B2 | 5/2009 | Ghyselen et al. |
| 7,585,711 | B2 | 9/2009 | Chen et al. |
| 7,596,158 | B2 | 9/2009 | Liu et al. |
| 7,700,416 | B1 | 4/2010 | Clifton et al. |
| 7,825,470 | B2 | 11/2010 | Atanakovic |
| 7,897,444 | B2 | 3/2011 | Adam et al. |
| 8,115,254 | B2 | 2/2012 | Zhu et al. |
| 8,124,470 | B1 * | 2/2012 | Bedell ................. H01L 29/7847 257/E21.445 |
| 8,368,143 | B2 | 2/2013 | Bedell et al. |
| 8,731,017 | B2 | 5/2014 | Clifton et al. |
| 9,036,672 | B2 | 5/2015 | Clifton et al. |
| 9,209,301 | B1 | 12/2015 | Nguyen et al. |
| 9,270,083 | B2 | 2/2016 | Clifton et al. |
| 2001/0048119 | A1 | 12/2001 | Mizuno et al. |
| 2003/0089901 | A1 | 5/2003 | Fitzgerald |
| 2004/0021179 | A1 | 2/2004 | Lee et al. |
| 2004/0026765 | A1 | 2/2004 | Currie et al. |
| 2005/0059201 | A1 | 3/2005 | Chidambarrao et al. |
| 2005/0093021 | A1 | 5/2005 | Ouyang et al. |
| 2005/0106792 | A1 | 5/2005 | Cea et al. |
| 2005/0133817 | A1 | 6/2005 | Huang et al. |
| 2005/0255667 | A1 | 11/2005 | Arghavani et al. |
| 2006/0011906 | A1 | 1/2006 | Bedell et al. |
| 2006/0081837 | A1 | 4/2006 | Bedell et al. |
| 2006/0255330 | A1 | 11/2006 | Chen et al. |
| 2007/0029553 | A1 | 2/2007 | Ozturk et al. |
| 2007/0105251 | A1 | 5/2007 | Liu et al. |
| 2007/0164356 | A1 | 7/2007 | Adam et al. |
| 2007/0257249 | A1 | 11/2007 | Mocuta et al. |
| 2008/0026540 | A1 | 1/2008 | Liu |
| 2008/0116517 | A1 | 5/2008 | Anderson et al. |
| 2008/0124858 | A1 | 5/2008 | Nguyen et al. |
| 2008/0179636 | A1 | 7/2008 | Chidambarrao et al. |
| 2008/0233690 | A1 | 9/2008 | Yu |
| 2008/0237636 | A1 | 10/2008 | Jin et al. |
| 2008/0242097 | A1 | 10/2008 | Boescke et al. |
| 2008/0272391 | A1 | 11/2008 | Kapur et al. |
| 2009/0104746 | A1 | 4/2009 | Clifton et al. |
| 2009/0166866 | A1 | 7/2009 | Fastow et al. |
| 2009/0221115 | A1 | 9/2009 | Scott et al. |
| 2009/0278201 | A1 | 11/2009 | Chatty et al. |
| 2010/0207254 | A1 | 8/2010 | Jain et al. |
| 2010/0290217 | A1 | 11/2010 | Anantram et al. |
| 2011/0230026 | A1 | 9/2011 | Clifton |
| 2012/0139081 | A1 | 6/2012 | Zhu et al. |
| 2012/0199812 | A1 | 8/2012 | Baykan et al. |
| 2013/0196456 | A1 | 8/2013 | Morvan et al. |
| 2015/0243784 | A1 | 8/2015 | Morin |

FOREIGN PATENT DOCUMENTS

| | | |
|---|---|---|
| FR | 3051595 A1 | 11/2017 |
| FR | 3051596 A1 | 11/2017 |
| WO | 2011/044226 A2 | 4/2011 |
| WO | 2011/115859 A2 | 9/2011 |

OTHER PUBLICATIONS

Boucaud; et al., "Photoluminescence of a tensilely strained silicon quantum well on a relaxed sige buffer layer," CNRS Applied Physics Letters, Jul. 5, 2004, pp. 46-48, vol. 85, No. 1.

Bower; et al., "Low Temperature Si3N4 Direct Bonding," Department of Electrical and Computer Engineering, University of California, Department of Mechanical, Aeronautical and Material Engineering, University of California, Davis, CA 95616, Appl. Phys. Lett. 62 (26), Jun. 28, 1993, pp. 3485-3487.

Cannon; et al., "Tensile strained epitaxial Ge films on Si(100) substrates with potential application in L-band telecoms," Applied Physics Letters, Feb. 9, 2004, pp. 906-908, vol. 84, No. 6.

Chaudhari; et al., "Highly Compact Optical Waveguides With a Novel Pedestal Geometry," IEEE Photonic Technology Letts, 1995, pp. 526-528, vol. 7.

Chen; et al., "Quantum-Confined Direct Band Transitions in Tensile Strained Ge—SiGe Quantum Wells on Silicon Substrates," Nanotechnology, Feb. 24, 2010, p. 115207, vol. 21.

Cheng; et al., "Strain-Enhanced Photoluminescence From Ge Direct Transition" Applied Physics Letters, 2010, pp. 211108-1-211108-3, vol. 96.

Cheng; et al., "Competitiveness Between Direct and Indirect Radiative Transitions of Ge," Applied Physics Letters, 2010, vol. 96, pp. 091105-1-091105-3.

Cheng; et al., "Room Temperature 1.6 urn Electroluminescence from Ge Light Emitting Diode on Si substrate," Optics Express, Jun. 8, 2009, pp. 10019-10024, vol. 17, No. 12.

(56) References Cited

OTHER PUBLICATIONS

Cheng; et al., "Electrically Pumped Ge Laser at Room Temperature," Proc. of the IEEE International Electron Devices Meeting, Dec. 2007, pp. 659-662.
Chrastina; et al., "Ge—SiGe Multiple Quantum Wells For Optical Applications," IEEE Int. Conf. on Group IV Photonics, Sep. 2008, pp. 194-196.
Chung; et al., More Strain and Less Stress—The Guideline for Developing High-End Strained CMOS Technologies with Acceptable Reliability, National Chiao Tung University, Taiwan, 2008, pp. 435-438.
Doll; et al., "Versatile Low Temperature Wafer Bonding and Bond Strength Measurement by a Blister Test Method," Laboratory for Design of Microsystems, Institute for Microsystem Technologies (IMTEK), University of Freiburg, Georges-Koehler-Allee 102, 79110 Freiburg, Germany, Microsyst Technol (2006) pp. 418-429, Oct. 7, 2005.
Eernisse, "Stress in Ion-Implanted CVD Si3N4 Films," Sandia Laboratories, Albuquerque, New Mexico 87115, Journal of Applied Physics, vol. 48, No. 8, Aug. 1977, pp. 3337-3341.
El Kurdi; et al., "GeOI Photonic Crystal Cavities Probed by Room-Temperature Photoluminescence," IEEE Int. Conf. on Group IV Photonics, Sep. 2008, pp. 19-20.
El Kurdi; et al., "Two-dimensional Photonic Crystals With Pure Ge-on-Insulator," Optics Communications, 2008, pp. 846-850, vol. 281, No. 4.
El Kurdi; et al., "Band Structure and Optical Gain of Tensile-Strained Germanium Based on a 30band k · p Formalism," J. Appl. Phys.,Jan. 2010, pp. 013710-1-013710-7, vol. 107.
El Kurdi; et al., "Control of Direct Band Gap Emission of Bulk Germanium By Mechanical Tensile Strain," Applied Physics Letters 2010, pp. 041909-1-041909-3, vol. 96.
Fischer; et al., "Elastic Misfit Stress Relaxation in Heteroepitaxial SiGe/Si Mesa Structures," Institute of Semiconductor Physics, Frankfurt, Germany, Sep. 22, 1992, pp. 2656-2658.
Gannavaram, et al. "Low Temperature (≤800°C) Recessed Junction Selective Silicon-Germanium Source/Drain Technology for Sub-70 nm CMOS," North Carolina State University (2000), Raleigh, NC, pp. 437-440.
German Application No. 11 2011 102 840.7, Office Action dated Jun. 26, 2014, 7 pages.
German Patent Office official communication dated Nov. 11, 2013 for German Patent Application No. 10 2012 015 309.0, 11 pgs. including English translation.
Harendt; et al., "Silicon Fusion Bonding and Its Characterization," Institute for Microelectronics Stuttgart, Allmandring 30a. D-7000 Stuttgart 80, Federal Republic of Germany]. Micromech, Microeng 2 (1992) Sep. 1, 1992, pp. 113-116.
Hollander; et al. "Strain Relaxation of Pseudomorphic Si1 xGex/ Si(100) Heterostructures by Si+ ion implantation," Nuclear Instruments and Methods in Physics Research B 242, 2006, pp. 568-571.
Hsu; et al., "Low Temperature LPCVD SiN Direct Bonding for Sensors," DIMES-ECTM, Delft University of Technology, Faculty of Electrical Engineering, Mathematics and Computer Science; DIMESEI, Delft University of Technology, Faculty of Electrical Engineering, Mathematics and Computer Science, Dept. of Microelectronics, Mekelweg 4, 2628 CD Delft, the Netherlands; Oct. 2005, pp. 162-166.
Hu; et al., "Electroluminescence From Ge on Si Substrate at Room Temperature," Applied Physics Letters, Aug. 2009, pp. 092102-1-092102-3, vol. 95.
Huo; et al., "Strong Enhancement of Direct Transition Photoluminescence with Highly Tensile Strained Ge," Applied Physics Letters, 2011, pp. 011111-1-011111-3, vol. 98.
Jain; et al., "Stresses and Strains in Lattice-Mismatched Stripes, Quantum Wires, Quantum Dots, and Substrates in Si Technology," Applied Physics Reviews, 79(11), Jun. 1996. pp 8145-8165.
Jan; et al., "A 45mm Low Power System-Pm-Chip Technology with Dual Gate (Logic and I/O) High-k/Metal Gate Strained Silicon Transistors", Logic Technology Development, Intel Corporation, Hillsboro, Oregon, downloaded Jul. 22, 2009, 4 pages.
Kawasaki; et al., "Impact of Parasitic Resistance and Silicon Layer Thickness Scaling for Strained-Silicon MOSFETs on Relaxed Si1-xGex Virtual Substrate" SOC Research & Development Center and System LSI Division (2004), Toshiba Corporation Semiconductor Company, Yokohama Japan, 4 pages.
Korean Patent Application No. 10-2013-7006498, Notification of Provisional Rejection mailed Dec. 26, 2013, 6 pages.
Li; et al., "Systematic Low Temperature Silicon Bonding Using Pressure and Temperature," Department of Electrical and Computer Engineering, University of California Davis, Davis, CA 95616, USA, Jpn. J. Appl. Phys., vol. 37 (1998) pp. 737-741, Part 1, No. 3A, Mar. 15, 1998.
Li; et al., "Enhanced Photoluminescence of Strained Ge with a Delta-Doping SiGe Layer on Silicon and Silicon-On-Insulator," Applied Physics Letters, Dec. 2009, pp. 251102, vol. 95.
Liang; et al., "Recent Progress in Lasers on Silicon," Nature Photonics, Jul. 2010, pp. 511-517, vol. 4.
Liao; et al., "Electroluminescence From the Ge Quantum Dot MOS Tunneling Diodes," Electron Device Letts., Apr. 2006, pp. 252-254, vol. 27.
Lim; et al., "Enhanced Direct Bandgap Emission in Germanium by Micromechanical Strain Engineering," Optics Express, Aug. 31, 2009, pp. 16358-16365, vol. 17, No. 18.
Lim; et al., "Enhanced Direct Bandgap Emission from Germanium-Based Ring Resonators," IEEE Int. Conf. on Group IV Photonics, Sep. 2008, pp. 356-358.
Liu; et al., "Ge-Based Active Devices for Si Photonics," Proc. Group IV Photonics Conf., Sep. 2007, pp. 279-281.
Liu; et al., "Tensile-Strained, n-type Ge as a Gain Medium For Monolithic Laser Integration on Si," Optics Express, Sep. 3, 2007, pp. 11272-11277, vol. 15, No. 18.
Liu; et al., "Ge on Si Laser Operating at Room Temperature," Optics Letters, Mar. 2010, pp. 679-681, vol. 35, No. 5.
Menendez; et al., "Type-I Ge/Ge1-x-ySixSny Strained-Layer Heterostructures with a Direct Ge bandgap," Applied Physics Letters, Aug. 16, 2004, pp. 1175-1177, vol. 85.
Miclaus; et al., "Wafer Bonding of (211) Cd0.96Zn0.04 Te on (001) Silicon," University of California, Los Angeles, Department of Materials Science and Engineering, Los Angeles, CA 90005; Raytheon Vision Systems, Goleta, CA 93117, pp. 552-555, Jun. 2004.
Novikov; et al., "Intense Photoluminescence from GeSi Self-Assembled Islands Embedded in a Tensile-Strained Si Layer," Semicond. Sci. Tech., 2007, pp. S29-S32, vol. 22.
PCT International Search Report and Written Opinion mailed Nov. 2, 2011, from the European Patent Office, for International Patent Application No. PCT/US11/049106 (filed Aug. 25, 2011), 11 pages.
PCT International Search Report and Written Opinion mailed Feb. 8, 2006, from the European Patent Office, for International Patent Application No. PCT/US05/0235335 (filed Jul. 15, 2005), 13 pages.
PCT International Search Report and Written Opinion mailed Sep. 28, 2007, from the European Patent Office, for International Patent Application No. PCT/US07/006171 (filed Mar. 17, 2006), 11 pages.
PCT International Search Report mailed Jul. 30, 2003, from the European Patent Office, for International Patent Application No. PCT/US03/10180 (filed Apr. 2, 2003), 7 pages.
Reshotko; et al., "Waveguide Coupled Ge-on-oxide Photodetectors for Integrated Optical Links," Proc. Group IV Photonics Conf., Sep. 2008, pp. 182-184.
Shi; et al., "Modifying Residual Stress and Stress Gradient in LPCVD Si3N4 Film with Ion Implantation," National Key Laboratory of Nano/Micro Fabrication Technology, Institute of Microelectronics, Peking University, Beijing 100871, PR China, Nov. 21, 2005, pp. 352-357.
Sun; et al., "Band-Engineered Ge for Si-based Light Emitter" electrochem.org, 2008, Abstract, 1 page, Electro Chemical Society.
Sun; et al., "Direct Gap Photoluminescence of n-type Tensile-Strained Ge-on-Si," Applied Physics Letters, Jul. 2009, p. 011911, vol. 95.
Sun; et al., "Room-Temperature Direct Bandgap Electroluminescence from Ge-on-Si Light-Emitting Diodes," Optics Letters, Apr. 2009, pp. 1198-1200, vol. 34.

(56) References Cited

OTHER PUBLICATIONS

Tabata; et al., "Control of Internal Stress and Young's Modulus of Si3N4 and Polycrystalline Silicon Thin Films Using the Ion Implantation Technique," Toyota Central Research and Development Laboratories Inc., Nagakute-cho, Aichi-gun, Aichi-ken 480-11, Japan, American Institute of Physics, Appl. Phys. Lett 56 (14), Apr. 12, 1990 pp. 1314-1316.
Thompson; et al. "A 90-NM Logic Technology Featuring Strained-Silicon" Logic Technology Development, Intel Corporation, Hillsboro, OR, 2004, pp. 1790-1797.
Vyatkin, "The Role of Point Defects In Strain Relaxation in Epitaxially Grown SiGe Structures," Elsevier B.V., Russia, Nov. 18, 2005, pp. 90-95.
Watanabe; et al., "A Low Power 40nm CMOS Technology Featuring Extremely High Density of Logic (2100kGate/nm2) and SRAM (0.195f.μm2) for Wide Range of Mobile Applications with Wireless System" System LS1 Division, Toshiba Corporation, Yokohama, Japan, downloaded Jul. 22, 2009, 4 pages.
Wiegand; et al., "Wafer Bonding of Silicon Wafers Covered with Various Surface Layers," Max-Planck Institut fur Mikrostrukturphysik, Weinberg 2, Halle an der Saale D-06120, Germany, CIS, Centrum fur Mikrosensorik E.V., Haarbergstrasse 61, Erfurt D-99097, Germany, Elsevier Science B.V., Oct. 16, 2000, pp. 91-95.
www.compound.semiconducter.net "LETI Shows Off New CMOS Laser," May 2010, p. 12.
Yamamoto; et al., "Effect of Low-Dose Ion Implantation on the Stress of Low-Pressure Chemical Vapor Deposited Silicon Nitride Films," ULSI Device Development Laboratories, NEC Corporation, Shomokuzawa 1120, Saganihara, Kanagawa,Japan,Jpn.J. Appl. Phys., vol. 37 (1998) pp. 1256-1259, Part 1, No. 3B, Mar. 3, 1998.
Yin; et al., "Uniaxial Strain Relaxation on Ultra-thin Strained-Si Directly on Insulator (SSDOI) Substrates," International Conference on Solid-State and Integrated Circuit Technology Proceedings, Oct. 2006, pp. 136-138.
Yin; et al., "Strain Partition of Si/SiGe and SiO2/SiGe on Compliant Substrates," Applied Physics Letters, vol. 82, No. 22,Jun. 2003, pp. 3853-3855.
Yu; et al., Effect of Uniaxial-Strain on Ge p-i-n Photodiodes Integrated Letters, Oct. 2009, pp. 161106, vol. 95.
Zhang; et al., "Prediction that Uniaxial Tension Along 111 Produces Germanium," Phys. Rev. Lett., Apr. 17, 2009, p. 156401, vol. 102.
Zhuang; et al. "Strain Relaxation in Periodic Arrays of Si/SiGe Quantum Wires Determined by Coplanar High-Resolution X-Ray Diffraction and Grazing Incidence Diffraction," Phys. D: Appl. Phys. 32 (1999), UK, pp. A224-A229.
International Search Report and Written Opinion mailed May 8, 2018, from the ISA/European Patent Office, for International Application No. PCT/US2018/014740 (filed Jan. 22, 2018), 15 pages.

\* cited by examiner

SOI WAFERS AND DEVICES WITH BURIED STRESSORS

CROSS REFERENCE TO RELATED APPLICATIONS

This application is a CONTINUATION of U.S. application Ser. No. 17/657,854, filed Apr. 4, 2022, which is a CONTINUATION of U.S. application Ser. No. 17/089,429, filed Nov. 4, 2020, now U.S. Pat. No. 11,322,615, which is a CONTINUATION of U.S. application Ser. No. 16/283,578, filed Feb. 22, 2019, now U.S. Pat. No. 10,833,194, which is a CONTINUATION of U.S. application Ser. No. 15/655,710, filed Jul. 20, 2017, which is (a) a NONPROVISIONAL of U.S. Provisional Application No. 62/364,801, filed Jul. 20, 2016, and (b) a CONTINUATION-IN-PART of U.S. application Ser. No. 15/594,436, filed May 12, 2017, now U.S. Pat. No. 10,084,091, which is a CONTINUATION of U.S. application Ser. No. 15/191,369, filed Jun. 23, 2016, now U.S. Pat. No. 9,673,327, which is a DIVISIONAL of U.S. application Ser. No. 13/762,677, filed Feb. 8, 2013, now U.S. Pat. No. 9,406,798, which is a CONTINUATION of U.S. application Ser. No. 12/869,978, filed Aug. 27, 2010, now U.S. Pat. No. 8,395,213, each of which is incorporated by reference in its respective entirety.

FIELD OF THE INVENTION

The present invention relates to strained semiconductor on insulator structures, and devices fabricated therefrom, which incorporate strained active layers containing silicon, where the strain is induced by compressive or tensilely-stressed buried insulator structures that are allowed to relax before devices are fabricated in the active layers.

BACKGROUND

Strained silicon is widely viewed as an important technology for obtaining desired advancements in integrated circuit performance. As explained in U.S. Pat. No. 8,395,213, strained silicon is conventionally obtained by first growing a thick layer of silicon germanium alloy (SiGe) on a silicon substrate. The SiGe layer is grown to a sufficient thickness such that the SiGe layer is relaxed to an unstrained condition at its surface. The in-plane lattice parameter of the SiGe surface is similar to that of a bulk crystal of SiGe of the same composition. SiGe alloys have larger lattice parameters than silicon. Hence the relaxed surface of the SiGe layer provides an in-plane lattice parameter larger than that of silicon. A subsequent thin layer of silicon is grown epitaxially on the relaxed surface of the SiGe layer. The thin epitaxial layer of silicon assumes the larger in-plane lattice parameter of the SiGe and grows in a strained state with bonds in the crystal lattice elongated in the growth plane. This approach, sometimes known as substrate-strained silicon or "virtual substrate" technology, grows a thin pseudomorphic layer of strained silicon on the relaxed surface of a SiGe layer.

So long as the strained silicon layer does not exceed a thickness for strain relaxation, the tensile strain is maintained in the strained silicon layer through the various implantation and thermal processing steps typical of CMOS manufacturing. However, the use of relaxed SiGe as a "virtual substrate" to strain a subsequently deposited epitaxial silicon layer inevitably requires acceptance of a very high dislocation density in the SiGe layer because the SiGe relaxation mechanism is plastic in nature. In other words, relaxation in the SiGe layer only occurs through the generation of strain-relieving misfit dislocations.

U.S. Pat. No. 8,395,213 proposed a different method of manufacturing a semiconductor structure having a layer of strained silicon. In embodiments of that method, a semiconductor on insulator (SOD) substrate having a stressed buried insulator structure above a base substrate and a surface semiconductor layer was etched such that trenches were cut through the surface semiconductor layer and the stressed buried insulator structure into the base substrate, in a pattern defined by a mask layer. Etching the trenches allowed the stressed buried insulator structure to relax, thereby causing the surface semiconductor layer to be strained across a portion of its lateral extent between the trenches. Thereafter, an integrated circuit device having an active region in the now-strained surface semiconductor layer could be formed.

SOI wafers are available in various types. However, due to costs, SOI wafers with a buried oxide layer between the top (active) silicon structure and an underlying crystalline silicon host or "handle" wafer have become the preferred configuration for CMOS applications. The buried oxide (typically abbreviated to "BOX") layer structure may be formed by high dose implantation of oxygen and annealing (accomplished, for example, using the so-called SIMOX process). The BOX layer may also be formed by wafer bonding a layer of silicon from a donor wafer to a BOX layer on a handle wafer. The bonded thin silicon layer may be separated from the donor wafer by subjecting the donor wafer to hydrogen ion implantation prior to bonding to create a defect layer at a depth corresponding to the desired thickness of the thin silicon layer and subsequently applying a force to laterally section the silicon on insulator wafer structure along the plane of the damage layer and so separate the silicon on insulator wafer from the donor wafer. An example of a process that forms BOX layers by this method is described in U.S. Pat. No. 6,372,609. Wafers manufactured according to such a process are commercially available from Soitec, Inc., of Bernin, France. The BOX layers of conventional SOI wafers are not compressively stressed.

In U.S. Pat. No. 8,395,213, a further embodiment of the invention described therein included depositing a buried stressor (BS) layer, e.g., a silicon germanium (abbreviated to $Si_xGe_{1-x}$) layer, on a first substrate that contained silicon, where the BS layer has a higher concentration of germanium than the first substrate so that the BS layer is in a state of in-plane compressive stress. A second substrate having an insulating layer on one surface is then attached so that the insulating layer bonds to the BS layer. A portion of the second substrate is then removed, leaving a surface silicon layer on the insulating layer. As before, trenches are etched through the surface silicon layer, the insulating layer and the BS layer, and into the first substrate in a pattern defined by a mask layer, thereby straining the surface silicon layer across at least a portion of its width between walls of the trenches. An integrated circuit device may be formed with its active region in the surface silicon layer.

SUMMARY OF THE INVENTION

In an embodiment of the invention, a semiconductor structure includes a layer arrangement consisting of, in sequence, a semiconductor-on-insulator layer (SOI) over a buried oxide (BOX) layer over a buried stressor (BS) layer with a silicon bonding layer (BL) intervening between the BOX and the BS layers. The semiconductor structure may be created by forming the BS layer on a substrate of a first wafer; growing the BL layer at the surface of the BS layer;

wafer bonding the first wafer to a second wafer having a silicon oxide layer formed on a silicon substrate such that the silicon oxide layer of the second wafer is bonded to the BL layer of the first wafer, and thereafter removing a portion of the silicon substrate of the second wafer. The BS layer may be silicon germanium, and the BL layer may be substantially pure silicon. Subsequently, the semiconductor structure may be patterned, and trenches etched therein such that the trenches are of a depth sufficient to pass through the silicon oxide, BL, and BS layers and into the substrate of the first wafer, and filling the trenches with an oxide. Active devices may thereafter be formed in the SOI layer, between the trenches.

DETAILED DESCRIPTION

Figure 1:
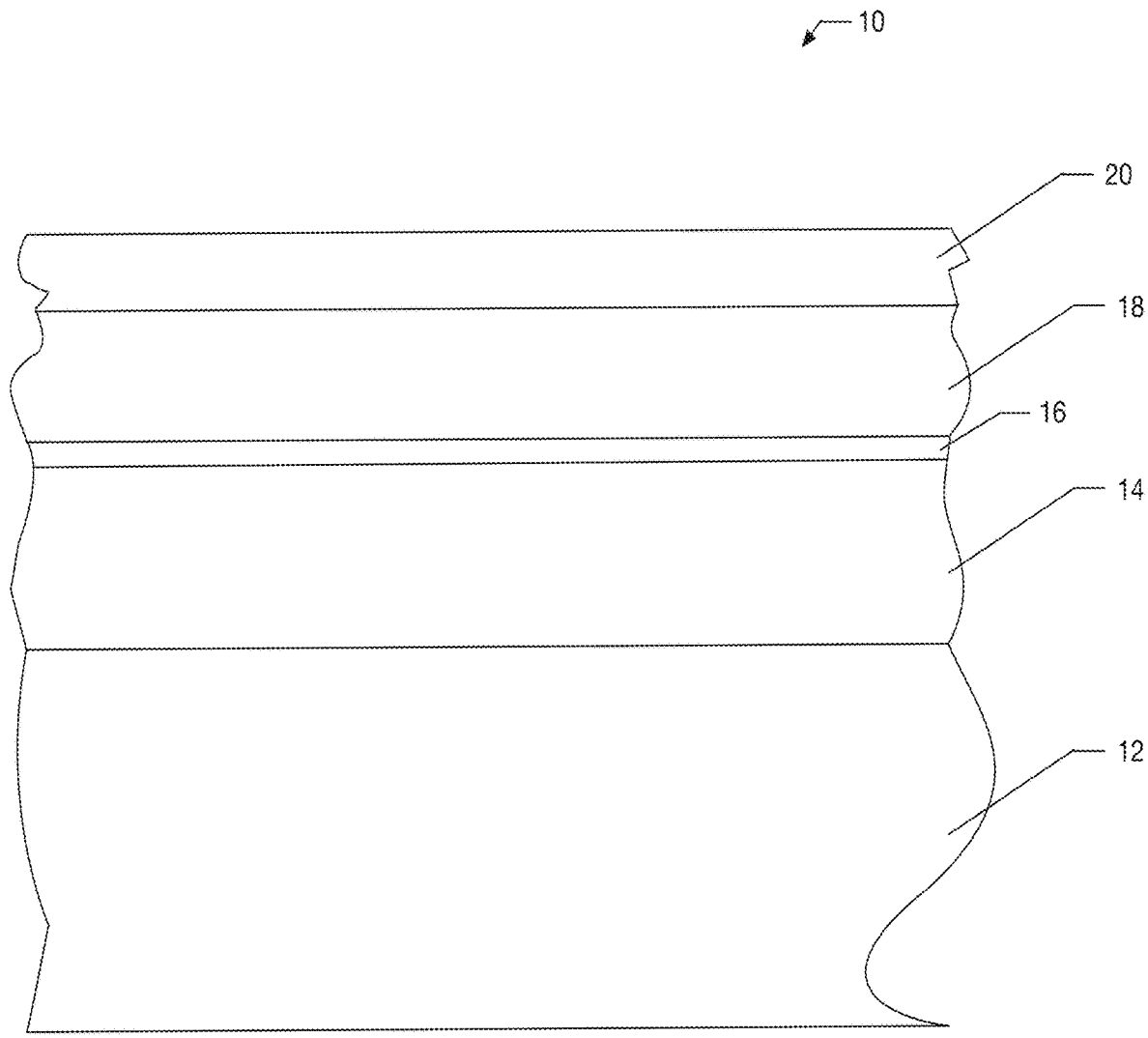
FIG. 1 shows schematically an SOI wafer according to an aspect of the present invention.

A challenge in the production of SOI wafers and devices based on such structures with BS layers beneath the oxide in the fashion described in U.S. Pat. No. 8,395,213 arises if the BS layer does not provide an ideal surface for bonding. Silicon is a very satisfactory material for a handle wafer and methods are well established for obtaining complete bonding of an oxide layer with silicon with few or no bond defects. Pre-conditioning treatments are known that ensure reproducible, low-defect, bonded interfaces of high quality. Such treatments include wet chemical cleans or surface modifications and plasma surface conditioning. A buried stressor layer such as silicon germanium, on the other hand, may present difficulties in bonding, for example arising from the poor chemical stability of germanium oxide relative to silicon oxide or from precipitation of germanium atoms at the surface of the SiGe layer prior to bond formation.

SOI Wafers with Bonding Layer Between Buried Oxide and Buried Stressor Layer:

Because of the challenges in producing SOI wafers and devices based on such structures with BS layers beneath the oxide in the fashion described in U.S. Pat. No. 8,395,213, the present inventor has recognized a need to provide for bonding an oxide layer to a predominantly silicon surface with low-defectivity and high reproducibility and reliability while accommodating a buried stressor layer such as silicon germanium. In one embodiment, the present invention provides a method for forming a BS layer, such as silicon germanium, with a substantially pure silicon "bonding layer" at its upper surface, to which a buried oxide layer is bonded. The silicon bonding layer ("BL") provides a predominantly silicon surface that enables improved bonding of a buried oxide layer of an SOI wafer. The invention also includes, in some embodiments, a semiconductor structure (and/or a device made from or in such a structure) having a layer arrangement consisting of a semiconductor-on-insulator layer (SOI) over a buried oxide (BOX) over a BS layer such as silicon germanium with a silicon BL intervening between the BOX and the BS layers. The silicon BL may be exceedingly small, as thin as a monolayer of silicon, but more generally one or two nm thick so the surface remains chemically and physically a substantially silicon surface at the time of bonding to the oxide layer after cleaning and wet and dry conditioning treatments have been applied.

The substantially pure silicon BL may be formed by epitaxial growth on top of the BS layer, with the BS layer itself having been grown epitaxially. The distinct BS and BL (e.g., silicon germanium and silicon, respectively) layers may be formed in a continuous process in the same epitaxial deposition tool. The BS layer is not necessarily of uniform composition with depth. For example, a silicon germanium BS layer may be graded, starting with a low composition of germanium at the interface with the underlying silicon handle wafer and increasing with distance from that interface up to a higher level of germanium composition in the range 10% to 100%. The grading may extend over tens of nanometers and need not necessarily be linear.

The substantially pure BL may alternatively be formed by epitaxial growth at the top of a BS layer of graded composition, with the germanium fraction in the silicon germanium alloy being graded from a high value to zero, or close to zero, at the top surface (i.e., the interface with the BL layer). As an example, a silicon germanium layer may be formed with a starting composition of 40% germanium on a silicon wafer and the composition then graded down to negligible germanium at the top surface. The grading may extend over tens of nanometers and need not necessarily be linear.

In another example, a BS layer (e.g., silicon germanium) may be formed on a silicon handle wafer, starting with a low germanium fraction, grading up to a high fraction around 50% or more then grading back down to a negligible germanium fraction at the top surface. The graded layers may have thicknesses in the range of tens of nanometers. The grading need not necessarily be linear.

After bonding, high temperature processes may be applied to the wafer, either as part of the SOI wafer production process or during the processing of semiconductor devices on the SOI wafers. The high temperature processes may cause germanium in a silicon germanium BS layer to diffuse, upwards and downwards (with these directions being oriented orthogonal, or approximately so, to the plane of the BS layer), with the upward diffusion of germanium transforming the silicon BL layer to silicon germanium. In such cases, a distinct silicon bonding layer may no longer be discernable in the finished device and the silicon germanium BS layer may be observed to extend all the way to the BOX layer, even though an intervening silicon bonding layer had existed at the time of bonding.

In other embodiments, the silicon BL intervening between the BOX and the BS layer remains at the end of the device manufacturing process. In such embodiments, it may be advantageous that the work function of the back gate is the work function of silicon, as is customary in SOI device design. That is, despite the presence of the BS layer, which may have a work function different than silicon, especially when doped p-type, the work function of the back gate will be the work function of the silicon BL, which may be doped n-type or p-type, as appropriate, in the course of a device manufacturing process.

Referring now to FIG. 1, a semiconductor structure 10 is shown. The structure includes, in sequence, a semiconductor substrate (e.g., Si, or a semiconductor alloy containing Si) 12, a buried stressor (BS) layer (e.g., a silicon germanium layer) 14, a thin bonding layer (BL) of silicon 16, a BOX layer 18, and an active semiconductor (e.g., Si, or a semiconductor alloy containing Si) layer 20. Semiconductor structure 10 may be comprise an entire wafer or just a portion thereof.

In one embodiment, semiconductor structure 10 is formed by first forming the BS layer 14 on the substrate 12. In one example, the BS layer is silicon germanium and the substrate is silicon or a semiconductor alloy containing silicon, and BS layer 14 is grown epitaxially on the substrate 12. Preferably, the BS layer is grown to a thickness less than a "critical thickness," at which misfit dislocations are generated. The BL 16 may be very thin, for example as thin as a monolayer, but is more generally one or two nm thick so the surface remains chemically and physically suitable for bonding to the BOX layer after it has been cleaned and conditioned. BL 16 may be formed by epitaxial growth on top of BS layer 14, with BS layer 14 itself having been grown epitaxially as discussed above. The distinct BS and BL (e.g., in one embodiment silicon germanium and silicon, respectively) layers 14, 16, may be formed in a continuous process.

To complete the formation of the layered structure 10 shown in FIG. 1, a "wafer bonding" process may be employed. In this procedure, a silicon oxide layer 18, e.g., of thickness in the range 5 nm to 80 nm, is formed on a donor silicon wafer, while the in-plane, compressively strained BS layer 14, of thickness in the range 5 nm to 70 nm, is formed by an epitaxial growth process (such as chemical vapor deposition, "CVD") on a separate handle wafer. In one embodiment, the BS layer 14 may be silicon germanium, with an alloy composition between 5% germanium and 100% germanium and a thickness less than the "critical thickness" at which plastic relaxation occurs with formation of extended defects such as dislocations. The BL layer (e.g., silicon) 16 is then grown epitaxially over the BS layer 14 on the handle wafer, and the oxide layer 18 of the donor wafer is subsequently bonded to the BL layer 16 of the handle wafer. Because the BL layer 16 is pure silicon, conventional bonding techniques for silicon oxide to silicon can be employed. A majority of the thickness of the silicon donor wafer is then removed by any combination of processes to leave a thin layer of silicon 20 (e.g., a thickness in the range 0.2 nm to 50 nm) remaining on the silicon oxide layer 18 and the silicon oxide layer 18 bonded to the silicon BL layer 16 above the silicon germanium BS layer 14. In the specific example of FIG. 1, the layer thicknesses may be 15 nm of thin silicon layer 20; 25 nm of silicon oxide layer 18; one to two nm of silicon BL layer 16; and 32 nm of silicon germanium BS layer 14. The range of processes available for thinning the silicon layer 20 include: wafer cleaving (after proton or hydrogen implantation); wafer polishing; chemical mechanical polishing ("CMP"); and cyclic oxidation and wet etching with a solution of hydrofluoric acid.

After bonding, high temperature processes may be applied to the wafer, either as part of the SOI wafer production process or during the processing of semiconductor devices on the SOI wafers. Those high temperature processes may cause germanium in the BS layer 14 to diffuse, upwards and downwards (with respect to the plane of BS layer 14), with the upward diffusion of germanium transforming the silicon layer 16 to silicon germanium. In such cases, a distinct silicon bonding layer 16 may no longer be discernable in the finished device and a silicon germanium BS layer 14 may be observed to extend all the way to the BOX layer 18, even though an intervening silicon bonding layer 16 had existed at the time of bonding.

In other embodiments, the silicon layer 16 intervening between the BOX layer 18 and the BS layer 14 remains at the end of the device manufacturing process. In such embodiments it may be advantageous that the work function of the back gate is the work function of silicon, which is the standard in SOI device design. That is, despite the presence of the buried silicon germanium, which may have a work function different than silicon, especially when doped p-type, the work function of the back gate will be the work function of the silicon bonding layer, which may be doped n-type or p-type as appropriate in the course of device manufacturing process.

Figure 2:
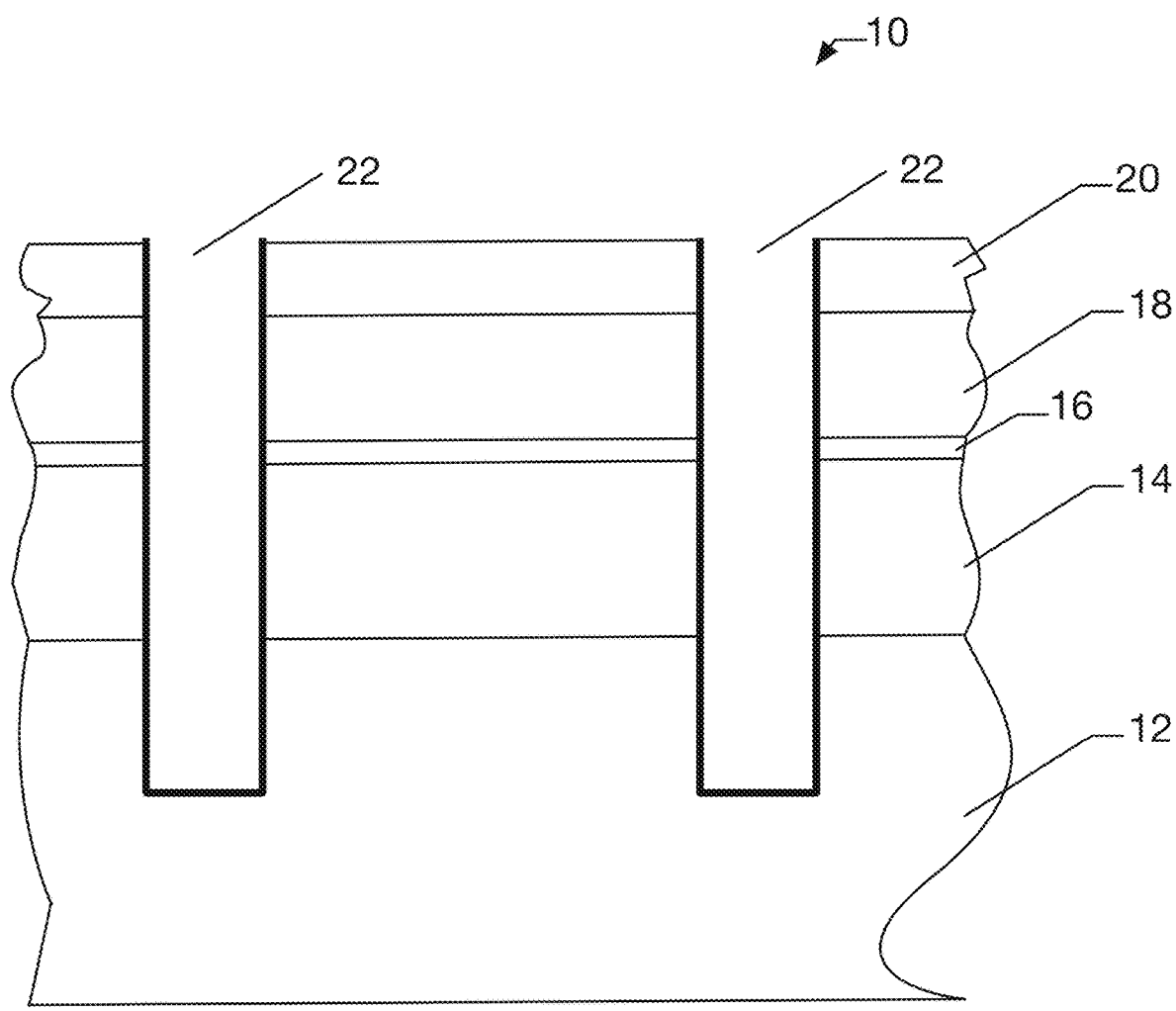
FIG. 2 shows schematically the wafer of FIG. 1 after further processing.

Referring now to FIG. 2, after formation of the layered structure 10, a pattern is created in a resistive material on the surface of the silicon layer 20 by any known lithographic method, the pattern defining trenches to be etched. Subsequently, trenches 22 are etched to a depth sufficient to pass through the BL and BS layers and into the underlying silicon. The trench etching process may be a dry etch process (such as plasma etching or reactive ion etching) or a wet etch process (such as buffered HF) or a combination of dry and wet etching processes. The resistive material is removed after completion of the trench etching process. After trench etching, a brief thermal process may be applied and then the trenches may be filled with an insulating material such as silicon dioxide. The brief thermal process may have a duration of between 1 millisecond and 60 seconds and may reach a maximum temperature of between 600° C. and 1200° C. The thermal process may be rapid thermal annealing (RTA), flash lamp annealing, laser annealing or any other rapid heating process. At the end of the process, the buried oxide 18 may be deformed, specifically as a result of it being thinner at the trench sidewalls due to migration of some of the silicon oxide laterally beyond the boundary of the trench sidewall.

Active devices, such as transistors, may be fashioned in or from semiconductor structure 10, for example, where the channel of such devices is present in semiconductor layer 20.

The BS layer 14 is not necessarily of uniform composition with depth. For example, a silicon germanium BS layer may be graded, starting with a low composition of germanium at the interface with the underlying silicon substrate 12, and increasing with distance from that interface up to a higher level of germanium composition in the range 10% to 100%. The grading may extend over tens of nanometers and need not necessarily be linear.

The substantially pure BL 16 may alternatively be formed by epitaxial growth at the top of a BS layer 14 of graded composition, with the germanium fraction in the silicon germanium alloy being graded from a high value to zero, or close to zero, at the top surface (i.e., the interface with the BL layer). As an example, a silicon germanium layer may be formed with a starting composition of 40% germanium on silicon substrate 12, and the composition then graded down to negligible germanium at the top surface interface with BL 16. The grading may extend over tens of nanometers and need not necessarily be linear.

In another example, the BS layer 14 may be formed on silicon substrate 12, starting with a low germanium fraction, grading up to a high fraction around 50% or more, then grading back down to a negligible germanium fraction at the top interface with BL 16. The graded layers may have thicknesses in the range of tens of nanometers. The grading need not necessarily be linear.

The invention is not limited to use of a silicon germanium BS layer or a silicon upper layer. The buried compressive stressor layer may be a silicon nitride layer and upper semiconductor layer 20 may be a semiconductor other than silicon such as: germanium; a silicon germanium alloy; germanium tin; silicon carbon or some other group IV semiconductor; a III-V compound semiconductor or a II-VI compound semiconductor; graphene or a transition metal dichalcogenide semiconductor.

Silicon Germanium Back Gate:

Above, mention was made of a "back gate." It is common for a semiconductor underlying and adjoining a buried oxide in a fully depleted silicon-on-insulator ("FDSOI") field effect transistor ("FET") to be doped and electrically contacted and used as a fourth terminal—a so-called "back gate." The back gate is especially effective when the buried oxide is ultra-thin (i.e., less than 50 nm and preferable less than 30 nm). A bias voltage may be applied to the back gate to modulate the threshold voltage of the FET.

The electrical potential of the back gate in the absence of an applied voltage bias is determined by the Fermi level in the back gate at the location where the back gate material forms an interface with the BOX. If the back gate material is silicon and it is doped n-type to a concentration approximately $2 \times 10^{19}$ donors/cm$^3$, the Fermi level is at or near the silicon conduction band. The location of the Fermi level relative to the conduction band in n-type silicon is given quite accurately by the Fermi-Dirac equation. Similarly, if the back gate material is silicon and it is doped p-type to a concentration around $2 \times 10^{19}$ acceptors/cm$^3$, the Fermi level is at or near the silicon valence band. The location of the Fermi level relative to the valence band in p-type silicon is given quite accurately by the Fermi-Dirac equation. The doping concentration has some influence over the Fermi level, which lies below the valence band for p-type doping concentrations in excess of about $2 \times 10^{19}$ acceptors/cm$^3$ and above the valence band for p-type doping concentrations less than about $2 \times 10^{19}$ acceptors/cm$^3$.

In embodiments of the present invention, the back gate material is silicon germanium alloy rather than silicon. The p-type dopant (acceptor) concentration in the silicon germanium determines the Fermi level relative to the valence band as it does in p-type silicon. But the present invention provides an additional control over the Fermi level in the back gate through the alloy composition of the silicon germanium. As the germanium fraction in the silicon germanium alloy is increased, the valence band energy is raised to be closer to the conduction band energy (the band gap is reduced). Thus, a silicon germanium back gate has an electrical potential that is a function of both the doping at the interface with the silicon BL layer (or the BOX if the silicon BL layer is made indistinguishable as a result of various processing steps) and the germanium fraction at the interface with the silicon BL layer (or the BOX).

In one embodiment of the invention, a p-type silicon germanium back gate has approximately constant composition with depth, the Fermi level of the back gate being determined by the alloy composition and p-type doping in the silicon germanium at its interface with the silicon BL layer (or the BOX). In another embodiment, the silicon germanium back gate has composition that varies with depth, the Fermi level of the back gate being determined by the alloy composition and p-type doping in the silicon germanium at its interface with the silicon BL layer (or the BOX). By having a varying composition, it is possible to separately optimize (a) the Fermi level of the back gate at the interface with the silicon BL layer (or the BOX), which has electrical consequences for the electrical operation of the transistor, and (b) the stress profile in the buried silicon germanium layer which has consequences for the level of tensile strain induced in the semiconductor layer 20, and therefore the electrical performance of the transistor through modification of the electron mobility and/or effective mass in the semiconductor layer 20.

Hard Mask/STI Fill Solutions—to Unconstrain Edge Relaxation:

It was noted in U.S. Pat. Nos. 8,395,213 and 9,406,798 that in conventional processes for etching isolation trenches (e.g., a shallow trench isolation or "STI" process), a silicon nitride hard mask is typically used and that such a hard mask may inhibit edge relaxation of the buried stressor layer. If edge relaxation is inhibited, the amount of strain induced in the upper semiconductor layer may be significantly lower than expected.

The present applicant has determined by experiment that a silicon nitride hard mask can be very efficient in suppressing edge relaxation to the extent that n-channel MOSFETs exhibited no detectable increase in drive current when switched on (gate and drain potentials both high) whether or not a buried stressor layer was incorporated under a semiconductor channel layer. Strain characterization by nano-beam diffraction of an example NFET with a buried silicon germanium stressor layer in a transmission electron microscope confirmed that negligible strain was induced in the silicon channel layer overlying a silicon germanium buried stressor, and moreover, that the silicon germanium buried stressor layer was not relaxed to a significant degree.

The constraining effect of the silicon nitride layer presents a significant challenge to the application of the buried stressor approach wherever it is desired to induce in-plane tensile strain in a semiconductor layer, such as in NFETs. The constraining effect of the hard mask could, in principle, be overcome by etching away the silicon nitride after etching the trenches. However, in a typical STI process the trenches are filled with insulating silicon oxide before the hard mask is removed and the STI fill continues to inhibit edge relaxation even after the silicon nitride hard mask is removed. A need arises therefore for STI processing methods that permit edge relaxation to occur in STI structures with buried stressors including those formed in SOI wafers with the buried stressor within or beneath the buried insulator (buried oxide) layer.

In one embodiment, the present invention provides a process that mitigates the constraining effect of a silicon nitride hard mask by either of two categories of methods: In a first approach. The silicon nitride hard mask is softened to make it more compliant either before or after etching of the trenches and before filling the trenches with silicon oxide. In a second approach, the STI trench fill material is softened to make it more compliant after removal of the silicon nitride hard mask.

In regard to the first approach (softening the hard mask), it is known that ion implantation into a thin layer of silicon nitride may (i) soften the silicon nitride, and/or (ii) cause the silicon nitride layer to be under compressive stress. Either or both of (i) and (ii) is beneficial to the tensile straining of a layer of semiconductor with a silicon nitride hard mask on top and a compressively stressed buried stressor layer beneath, with trenches etched as described above to cause elastic edge relaxation. Accordingly, both approaches are contemplated by the present inventor.

In one embodiment of this invention, a silicon nitride hard mask is softened such that the mechanical impedance of elastic edge relaxation by the silicon nitride is reduced and the top semiconductor layer is put under tensile strain before the STI trenches are filled and planarized and the hard mask subsequently removed. In another embodiment of this invention, the silicon nitride hard mask is put under compressive stress in the plane of the wafer by an ion implantation such that the compressive nitride exerts a force additional to that from the buried stressor layer, causing the top semiconductor layer to be put under tensile strain before the STI trenches are filled and planarized and the hard mask subsequently removed.

Figure 3:
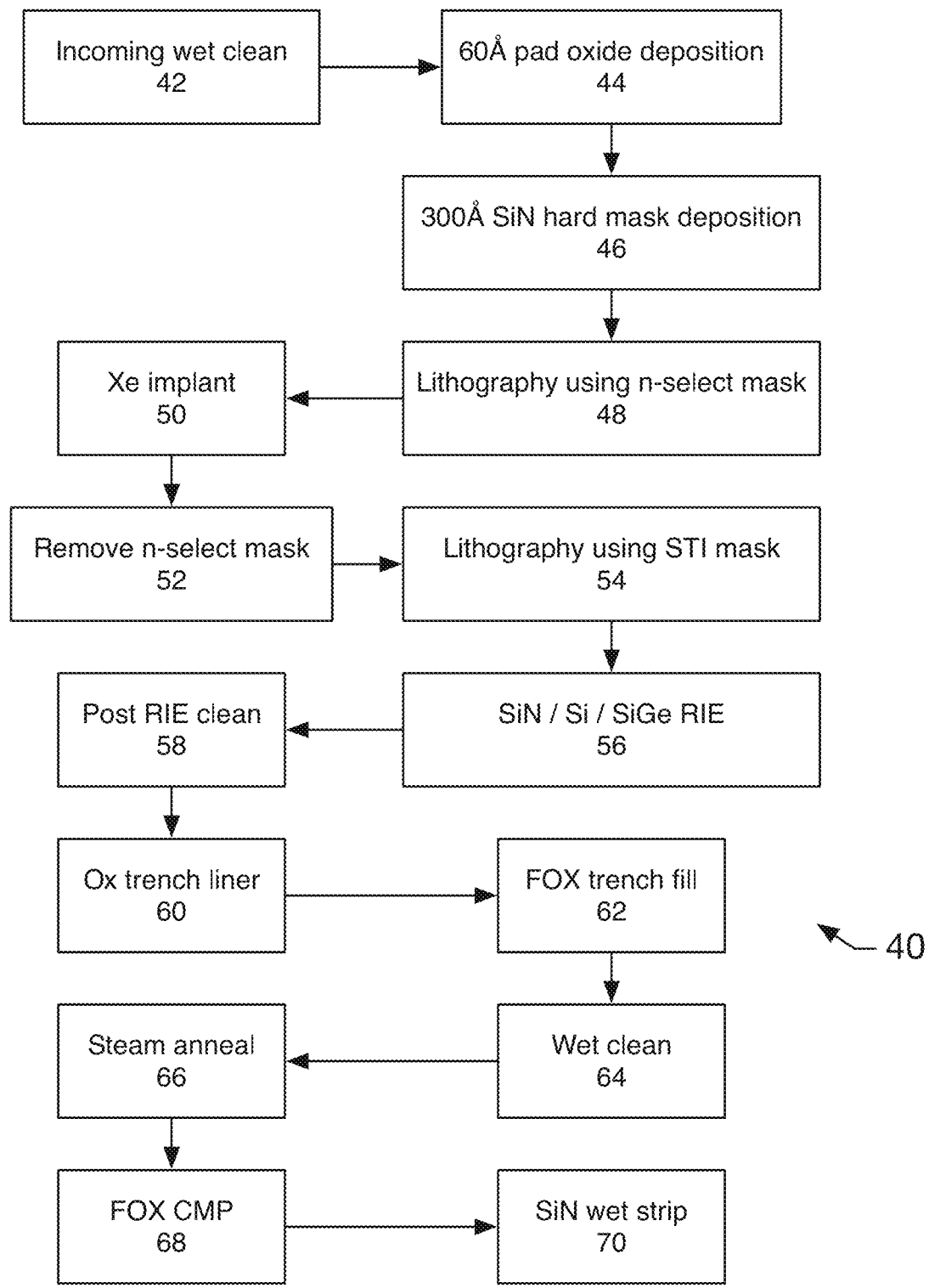
FIG. 3 illustrates one example of a process for softening a silicon nitride hard mask in accordance with the present invention.

An example of a process 40 for softening a silicon nitride hard mask in accordance with the present invention is illustrated in FIG. 3. At 42, a semiconductor wafer 10 having the layer structure shown in FIG. 1 is subject to a wet clean using a solvent, followed by a deionized water rinse. Typically, a two solvent cleaning process will be used to remove oils and organic residues, as well as residues from the first solvent (typically acetone). In one embodiment, the silicon wafer is placed in a warm (e.g., 55° C.) acetone bath for approximately ten minutes, and then transferred to a methanol bath for approximately 2-5 min. The wafer is removed from the methanol and rinsed with deionized water. Optionally, the wafer may then be blown dry with nitrogen. Following the solvent clean, the wafer may be cleaned of organic residue using a conventional RCA clean involving a mixture of ammonium hydroxide and hydrogen peroxide. The RCA clean leaves a native oxide on the wafer, which is removed using a conventional HF dip.

Next at 44, a 60 Å pad oxide is grown or deposited on the wafer, followed by deposition of a SiN hard mask at 46. The hard mask may be deposited to a thickness of approximately 300 Å. The mask is subsequently patterned using a resist 48 in an n-select manner, and an Xe implant at, for example, 40 Key and 100 KeV is carried out 50.

Following the ion implant, the n-select mask is removed 52, and an STI resist mask applied 54. The SiN hard mask, Si layer 20, BOX layer 18, BL layer 16, and SiGe BS layer 14 are then etched 56 to form trenches 22. The etch may be a reactive ion etch and may extend partially into the substrate 12. Following the etch, a post-RIE cleaning process is performed 58.

The wafer now has a structure similar to that illustrated in FIG. 2, with trenches 22 located at regions dictated by the STI mask. The trenches 22 are provided with an oxide liner 60, for example through deposition of TEOS or thermal growth, and thereafter a field oxide (e.g., silicon oxide) is deposited (e.g., at 5 kA) to fill the trenches 62.

One the trenches have been filled with the deposited oxide, the wafer is again subjected to a wet clean 64, followed by a steam anneal at approximately 500° C. 66. The remaining FOX is removed using a chemical mechanical polish process 68, and the remaining silicon nitride hard mask is removed using a wet strip 70.

In the second approach for mitigating the constraining effect of a silicon nitride hard mask, the STI trench fill material is softened to make it more compliant after removal of the silicon nitride hard mask. It is known that some silicon oxide formulations that may be applied as STI trench fill material may be softened and/or reflowed during a brief, high temperature annealing cycle after the trenches have been filled. After removal of the silicon nitride hard mask and during a period of time that the STI fill material is softened and/or reflowed by heating to a sufficiently high temperature, elastic edge relaxation is able to occur quite unimpeded and tensile strain is induced in a semiconductor layer overlying a buried stressor layer.

Accordingly, in an embodiment of this invention, the STI trenches are filled with an insulating material that may be softened and/or reflowed during a brief, high temperature annealing cycle. The insulating material is planarized and the hard mask subsequently removed. After removal of the silicon nitride hard mask, the assembly is heated to a temperature sufficient to cause softening and/or reflow of the STI fill material, thus allowing elastic edge relaxation of the buried stressor to occur and thus causing the top semiconductor layer to be put under in-plane tensile strain.

Figure 4:
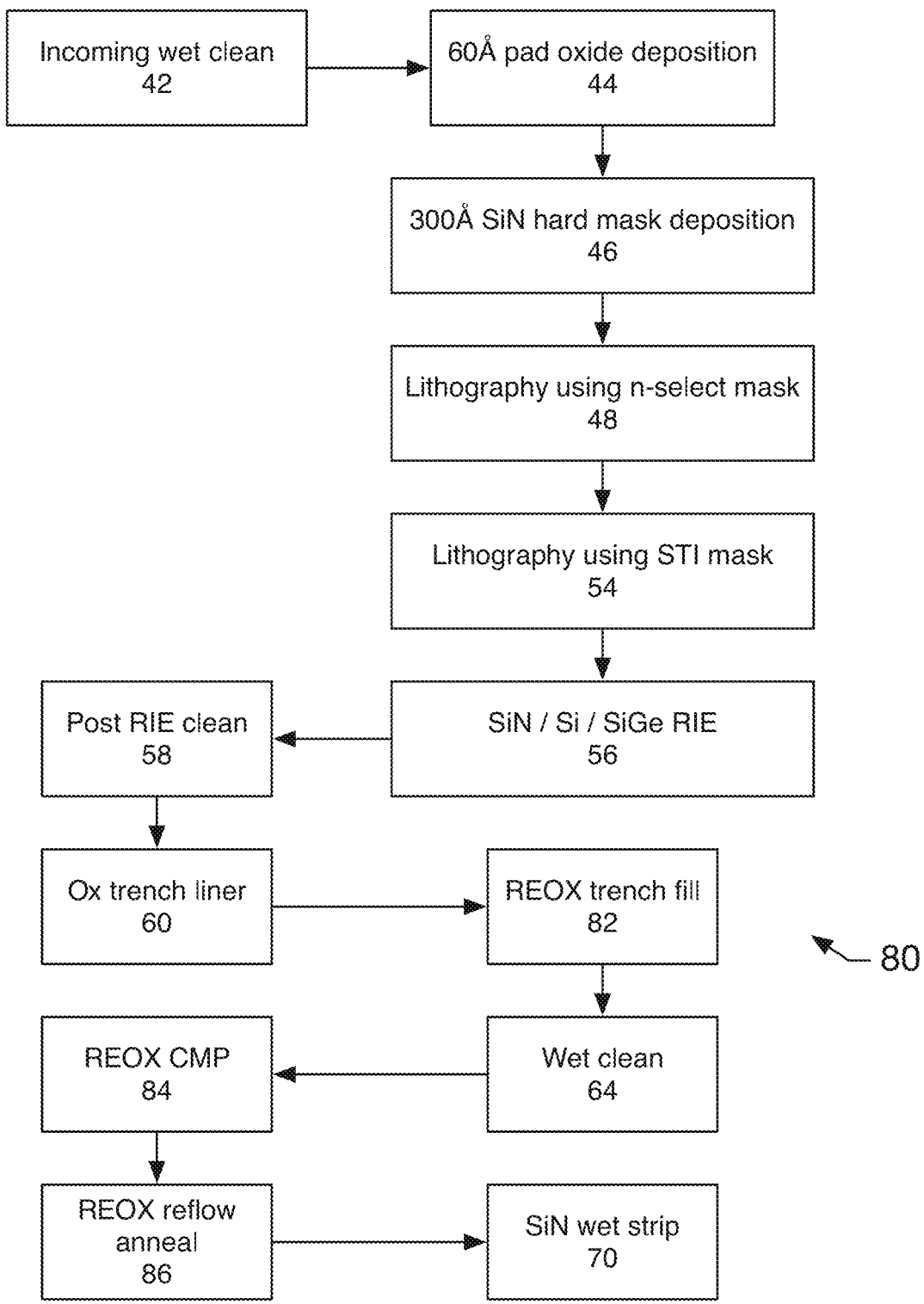
FIG. 4 illustrates one example of a process for softening STI trench fill material in accordance with the present invention.

An example of a process 80 for softening STI trench fill material in accordance with the present invention is illustrated in FIG. 4. As with the process for softening the hard mask, at 42 a semiconductor wafer 10 having the layer structure shown in FIG. 1 is subject to the wet clean procedure described above. Next at 44, a 60 Å pad oxide is grown or deposited on the wafer, followed by deposition of a SiN hard mask at 46. The hard mask may be deposited to a thickness of approximately 300 Å. The mask is subsequently patterned using a resist 48 in an n-select manner, and then patterned using an STI resist mask 54. The Si layer 20, BOX layer 18, BL layer 16, and SiGe BS layer 14 are then etched 56 to form trenches 22. The etch may be a reactive ion etch and may extend partially into the substrate 12. Following the etch, a post-RIE cleaning process is performed 58.

The wafer now has a structure similar to that illustrated in FIG. 2, with trenches 22 located at regions dictated by the STI mask. The trenches 22 are provided with an oxide liner 60, for example through deposition of TEOS or thermal growth, and thereafter the trenches are filled with an oxide 82. This time, the oxide is a reflowable silicon oxide (REOX).

One the trenches have been filled with the REOX, the wafer is again subjected to a wet clean 64, followed by removal of the REOX using a chemical mechanical polish process 84. The REOX is then allowed to reflow during an anneal 86, and the remaining silicon nitride hard mask is removed using a wet strip 70.

Avoiding Tensile Strain in PFETs by not Relaxing Hard Mask on PFETs:

It is generally understood that longitudinal tensile strain (i.e., strain directed along the same axis as electron flow) is beneficial to the performance of n-channel MOSFETs due to the mobility and velocity of electrons being improved by the tensile strain. In an embodiment of the invention, tensile strain is induced in NFETs by edge relaxation of buried stressor layer (e.g., a silicon germanium layer). On the other hand, longitudinal tensile strain adversely affects the performance of p-channel MOSFETs due to the mobility and velocity of holes being degraded by the tensile strain. Put another way, in-plane tensile strain is generally beneficial in NFETs but generally undesirable in PFETs. Yet NFETs are generally fabricated alongside PFETs in a common semiconductor layer. The need arises therefore to obtain tensile strain only in NFETs while avoiding in-plane tensile strain in PFETs.

Accordingly, in an embodiment of the invention longitudinal tensile strain in PFETs is avoided by using silicon nitride hard mask to inhibit edge relaxation in PFETs. At the same time, longitudinal tensile strain in permitted NFETs (typically manufactured in the same semiconductor layer as the PFETs) by selectively relaxing silicon nitride hard mask over the NFETs only (e.g., by ion implantation as discussed above). In one example, a silicon nitride hard mask is used to resist most or all of the tensile straining of an underlying semiconductor layer (e.g., Si layer 20 in the structure shown in FIG. 1), for example due to edge relaxation of a buried stressor, wherever a p-channel transistor is formed in the semiconductor layer.

In one embodiment, a silicon nitride hard mask layer is formed over a semiconductor layer which itself is disposed over a compressive buried stressor layer. A patterned ion implantation mask is formed over the silicon nitride hard mask layer such that there are windows in the implantation mask corresponding to the intended locations of n-channel MOSFETs (NFETs). Then, the silicon nitride hard mask layer is implanted with a species of ions of appropriate energy and dose through the windows in the implantation mask to soften the silicon nitride and/or cause the silicon nitride to be under in-plane compressive stress only wherever it is exposed to the ions. The implanted ions do not enter the silicon nitride hard mask layer except where it is exposed by a window in the implantation mask. After the ion implantation, the implantation mask is removed and an STI mask pattern is formed over the silicon nitride hard mask layer, the STI mask pattern defining active regions corresponding to both NFETs and PFETs. Then, isolation trenches are etched through the silicon nitride hard mask layer, the semiconductor layer and the compressive buried stressor layer (and any intervening oxide and BL layers, if present) in a pattern as defined by the STI mask pattern. By this method, edge relaxation is only effective in the NFET regions due to the softening of the silicon nitride mask and/or compressive stress in the silicon nitride hard mask that resulted from the ion implantation step.

Engineering Preferred Strain in PMOS Using Shallow and Deep Trenches:

In an embodiment of the invention, a method and structure providing only transverse tensile strain in p-channel MOSFET devices through use of a two-step isolation process is provided. The two-step process involves transverse isolation by trenches, and ultra-shallow longitudinal isolation avoiding cutting through the buried stressor layer.

For p-channel MOSFETs it is desired to obtain transverse tensile strain while preserving longitudinal compressive strain (e.g., longitudinal compressive strain induced by source/drain stressors). Accordingly, in one method of manufacturing a semiconductor device an SOI substrate having an in-plane compressively stressed buried insulator structure above a base substrate and a surface semiconductor layer is provided. The surface semiconductor layer is etched in a first pattern defined by a first photoresist mask layer, the first pattern defining an active width of the semiconductor device. Then, the surface semiconductor layer and the compressively stressed buried insulator structure are etched in a first etch step, with the etch being continued into the base substrate, thereby straining the surface semiconductor layer uniaxially across at least a portion of a lateral extent of the surface semiconductor layer between walls of two trenches formed in the etching, the lateral extent defining the active width of the semiconductor device. The surface semiconductor layer is etched in a second pattern defined by a photoresist mask layer, the second pattern defining an active length of the semiconductor device. Then, the surface semiconductor layer and the compressively stressed buried insulator structure are etched in a second etch step, with the etch depth being shallow and not deeper than the compressively stressed buried insulator structure (not continued into the base substrate), thereby avoiding straining the surface semiconductor layer across a lateral extent of the surface semiconductor layer between walls of two trenches formed in the etching, the lateral extent defining the active length of the semiconductor device. Next, an integrated circuit device having an active region is formed in the surface semiconductor layer. In this embodiment, the semiconductor device is a p-channel MOS transistor with a channel region in the surface semiconductor layer and the straining of the surface semiconductor layer is in-plane tensile strained only in a transverse direction. The sequence of first pattern/first etch and second pattern/second etch may be reversed if desired with similar results in terms of selectively tensile strain in the width direction of p-channel MOS transistors. Such a process may be an adaptation of a litho-etch-litho-etch process as practiced in the industry.

In some instances, the stressed buried insulator structure consists of a layer of silicon dioxide on top of a layer of compressively strained silicon germanium. In other instances, the stressed buried insulator structure consists of a layer of silicon dioxide on top of a layer of compressively strained silicon nitride. In still further instances, the stressed buried insulator structure consists of a layer of compressively strained silicon nitride.

A further embodiment provides a p-channel MOSFET device structure with isolation structures that define the transistor active length not extending through the buried isolation structure and the isolation structures defining the transistor active width being deeper than the buried stressor structure and extending into the underlying substrate.

A further embodiment provides a semiconductor device structure (e.g., a p-channel MOSFET) includes a substrate (e.g., a Si substrate or a substrate including Si) and has first and second walls of two trench isolation structures extending partially into the substrate, the first and second walls defining the active width of the device. The semiconductor device also includes a substrate interface region extending between the first and second walls. A stressor structure (e.g., $Si_xGe_{1-x}$) overlying the substrate interface region extends over a lateral extent between the first and second walls. A buried insulation structure overlying the stressor structure extends over a lateral extent between the first and second walls and has an insulating upper region. A surface semiconductor layer formed on the buried insulation structure extends between the first and second walls and has uniaxial in-plane tensile strain induced over at least a portion of the surface semiconductor layer extending between the first and second walls, the strain induced by elastic edge relaxation of the stressor structure. The substrate further has third and fourth walls of two trench isolation structures not extending into the substrate, the third and fourth walls defining the active length of the device. An integrated circuit device has an active region at least partially within the surface semiconductor layer.

The above-referenced U.S. application Ser. No. 12/869,978 describes, amongst other things, methods and structures that obtain desired levels of in-plane strain in a surface semiconductor layer by etching isolation trenches through a buried stressor layer that is situated either above, within, or beneath a buried insulation layer. The strain is induced by elastic edge relaxation of the buried stressor layer. In accordance with some embodiments of the present invention, longitudinal tensile strain in a surface semiconductor layer is avoided by ensuring that isolation trenches at the ends of the transistor active region are not deep enough to cut through the buried stressor layer. The isolation along the longitudinal axis uses instead a shallow cut of the SOI, not etching through the buried stressor. This solution requires separate patterning of transverse and longitudinal isolation, with the isolation trenches at the sides of the active region being deep enough to cut through the buried stressor layer. This approach to isolation is a type of double patterning scheme, more specifically a "lithography-etch-lithography-etch" double patterning scheme. The following process sequence is one example of such a technique.

In the first lithography step, a first isolation pattern is printed in a resist layer over a layer of hard mask material (typically silicon nitride) over the surface semiconductor layer. This first isolation pattern defines the length of a transistor active region ("longitudinal isolation").

In the first etch step, extremely shallow trenches are etched through the top (surface) semiconductor layer (e.g., Si layer 20 in FIG. 1) and optionally through the buried insulator layer (e.g., BOX layer 18), but not through the buried stressor layer (e.g., BS layer 14 and BL layer 16, if present). Following the first etch, the resist layer used in the first lithograph step is stripped, leaving all remaining regions of the hard mask layer in place.

In the second lithography step, a second (and different) isolation pattern is printed in a new resist layer over the same layer of hard mask material that is disposed over the surface semiconductor layer. This second isolation pattern defines the width of the transistor active region ("transverse isolation").

In a second etch step, trenches through the top (surface) semiconductor layer 20, through the buried insulator (e.g., "BOX") layer 18 and through the buried stressor (e.g., silicon germanium) layer 14 (and BL layer 16, if present) are etched, with the etch extending some small distance into the underlying substrate material (e.g. silicon) 12. Following this second etch, the second resist layer is stripped.

Finally, the isolation trenches are filled, for example with an oxide using a conventional STI fill process.

Figure 5:
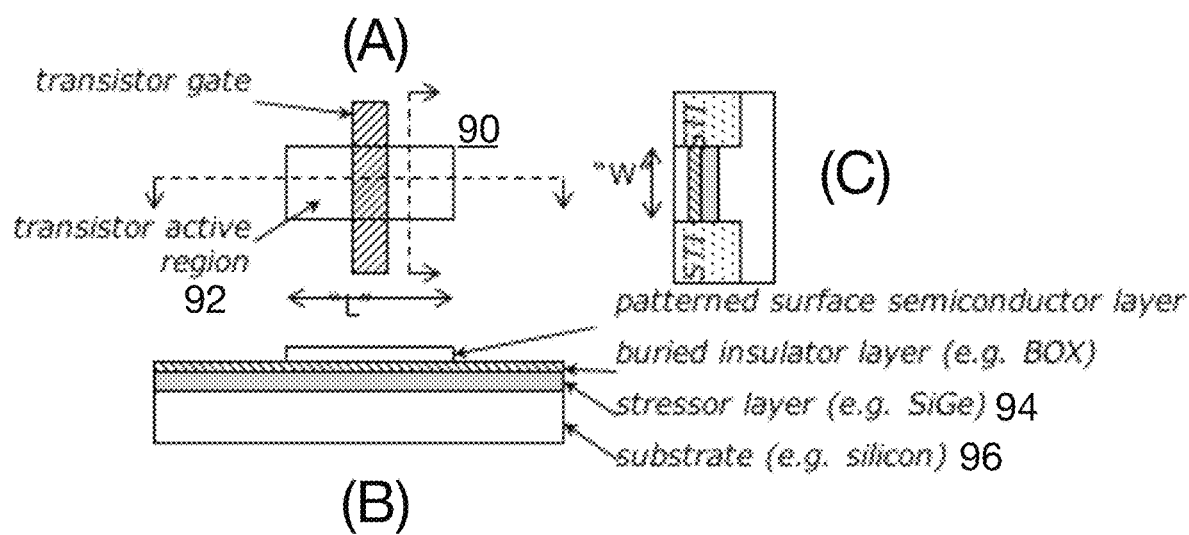
FIG. 5 illustrates top (A), lateral cross-sectional (B), and transverse cross-sectional (C) views of a transistor structure with an active region isolated according to an embodiment of the invention.

FIG. 5 illustrates top (A), lateral cross-sectional (B), and transverse cross-sectional (C) views of a transistor structure 90 with the transistor active region 92 isolated according to an embodiment of the invention. In this embodiment, transverse and longitudinal isolation trenches are patterned and etched in separate processes. Longitudinal isolation that defines transistor active length "L" is patterned and etched by an etch process that does not penetrate into the stressor layer 94. Transverse isolation that defines transistor active width "W" is patterned and etched by a different etch process that does penetrate through the stressor layer 94 and into the underlying material (substrate) 96. Transverse isolation trenches are filled with an insulating material and denoted here as "STI" because of the similarity to a typical shallow trench isolation structure.

Low Temperature Ultra-Thin SOI Method—Compatible with Silicon Germanium Stressor:

A further challenge in the production of SOI wafers with BS layers and of semiconductor devices based on such structures arises if the BS layer is a material, for example silicon germanium alloy, that cannot withstand a large thermal budget either because of degradation of the BS layer or diffusion of the BS layer or reaction of the BS layer with the BOX. Such a challenge arises specifically in the production of ultra-thin SOI wafers when the SOI layer is thinned by techniques that include high temperature oxidation steps. In the currently prevalent method of SOI wafer fabrication, the SOI layer is split off from a handle wafer and is subsequently thinned by thermal oxidation of the SOI layer and removal of the silicon oxide by hydrofluoric acid. Target thickness for the SOI layer is currently approximately 20 nm with uniformity of plus/minus 0.2 nm.

In some embodiments of the present invention, an ultra-thin and uniform SOI layer (such as Si layer 20) is formed over a BOX (such as layer 18) without recourse to thermal oxidation or the need for chemical mechanical polishing. The method(s) enable integration of a buried stressor layer underneath the BOX that would otherwise be degraded by high temperature thermal oxidation treatments of the composite SOI wafer. In such embodiments of the invention, a semiconductor layer of desired composition and thickness that will become the SOI layer of the finished wafer is prepared so as to provide a sacrificial release layer between the SOI layer and the donor wafer that allows separation of the SOI layer by a low temperature etch process. The release layer must have a different chemical composition than the SOI layer so that it may be etched selectively after bonding the SOI layer to the handle wafer, leaving the SOI layer in place on the BOX and releasing the donor wafer. An example release layer is epitaxial silicon germanium. Chemical etches are known that can remove silicon germanium, while leaving silicon relatively untouched. Another release layer that can be used in accordance with the invention is silicon oxide. Wet chemical etches, such as buffered hydrofluoric acid, are known that can remove silicon oxide very selectively while leaving silicon almost completely intact.

Embodiments of the invention include an optional step of patterning and etching holes through the donor wafer across the lateral extent of the donor wafer to allow the release etchant to access the release layer at many points or lines across the lateral extent of the release layer.

Figure 6:
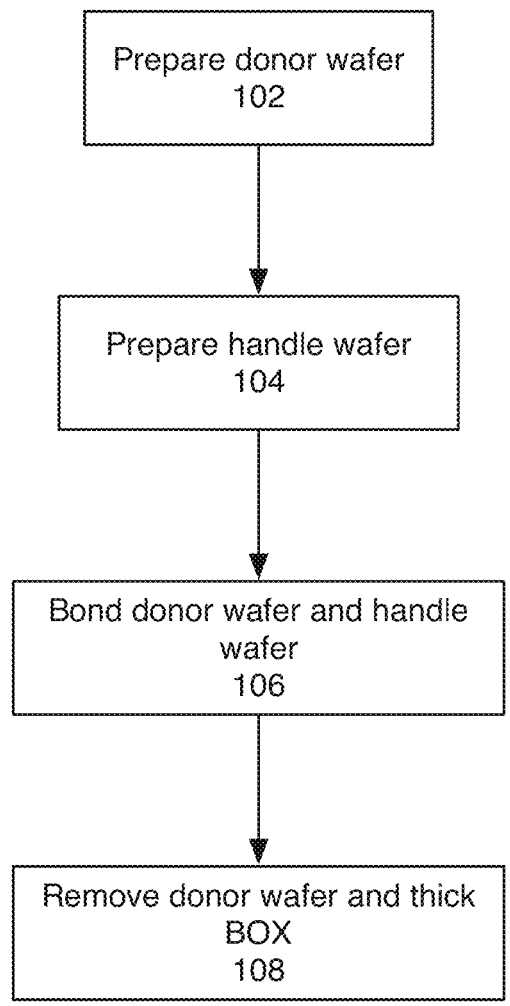
FIG. 6 illustrates one example of a process to provide an SOI wafer consisting of a thin SOI layer over a thin BOX layer over a buried stressor layer on a silicon handle wafer.

With reference to FIG. 6, one example of a process 100 to provide an SOI wafer consisting of a thin SOI layer over a thin BOX layer over a buried stressor layer on a silicon handle wafer is as follows: At 102, the donor wafer is prepared. This entails forming an ultra-thin SOI wafer with an ultra-thin layer of desired composition and thickness and a BOX layer that is not ultra-thin. Any conventional technique for forming and thinning of the SOI layer to a desired, uniform thickness may be used. There is no thermal limitation on this procedure, as it is undertaken in the absence of a thermally-sensitive buried stressor layer. Next, a thin BOX layer is formed on the surface of the SOI layer, for example by oxidation of the surface of the ultra-thin SOI layer. Finally, hydrogen ions are implanted to a depth greater than the bottom interface of the BOX layer.

Next, in 104, the handle wafer is prepared. Note, this step may be done concurrently, at least in part, with step 102, or may, in part, be done prior to step 102. The handle wafer will include a buried stressor layer. In one embodiment, the buried stressor layer is formed on a silicon wafer, and may be compressively strained epitaxial silicon germanium, optionally terminated by a surface silicon layer as discussed above. The buried stressor layer may, alternatively, be compressively or tensile strained silicon nitride. In still other embodiments, the buried stressor layer may be compressively or tensile strained metallic material. Once formed, the surface of the handle wafer is cleaned and conditioned by a conventional wet or dry technique.

Figure 7:
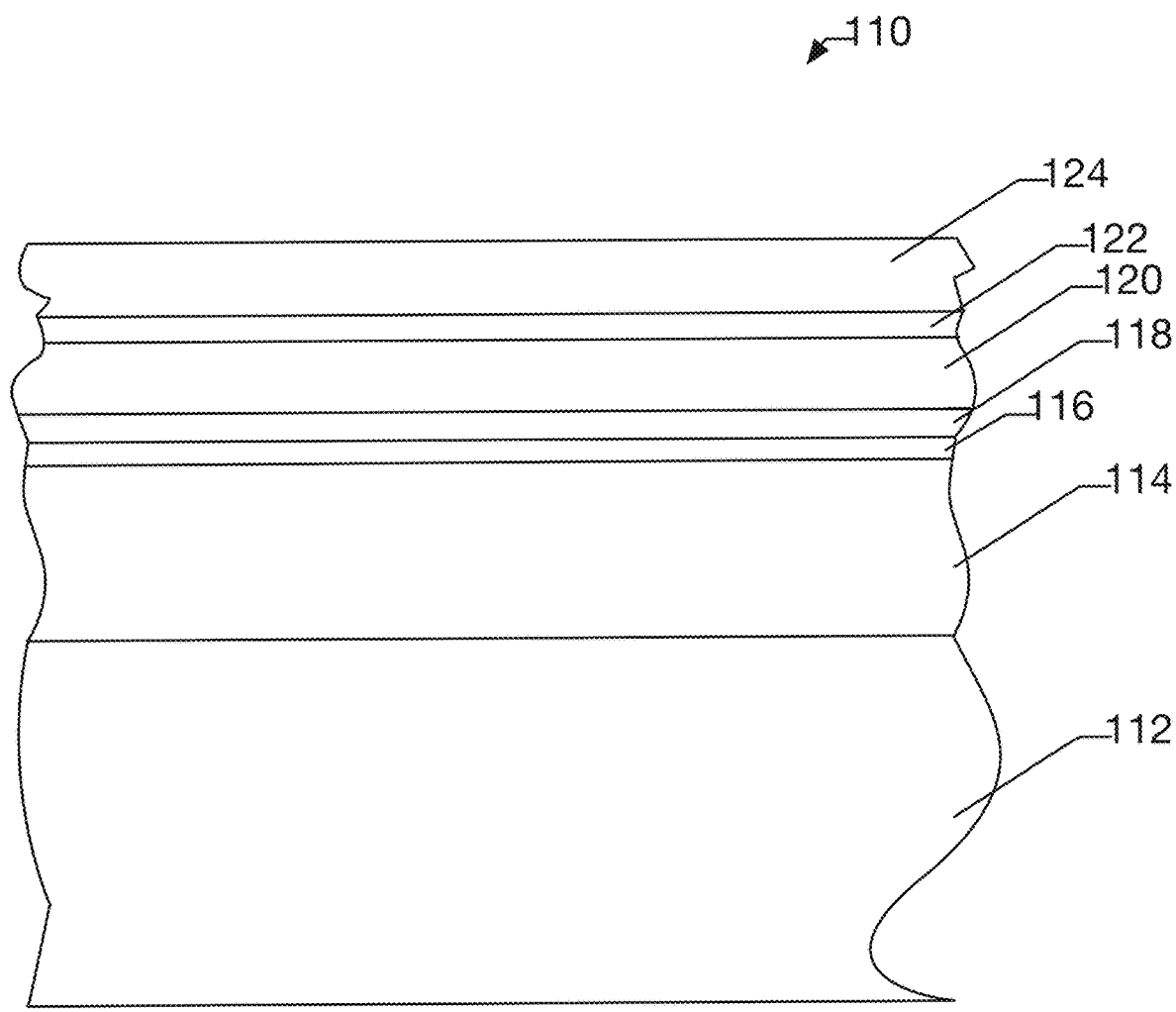
FIG. 7 shows schematically an SOI wafer produced in accordance with the process of FIG. 6.

At 106, the donor and handle wafers are bonded. Any conventional bonding technique may be employed such that the thin BOX layer on the surface of the donor wafer contacts the buried stressor layer on the surface of the handle wafer, where the buried stressor layer may optionally be terminated by a thin silicon layer as discussed above. The result is a composite structure 110, illustrated in FIG. 7, consisting of, in sequence: bulk donor wafer 112, thick BOX layer 114, thin SOI layer 116, thin BOX layer 118, BS layer 120 (with optional BL layer 122 at its surface), and bulk handle wafer 124.

Figure 8:
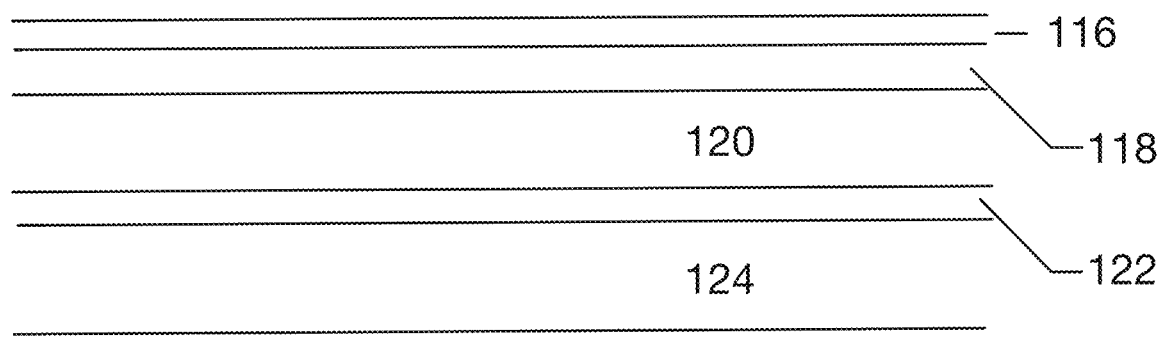
FIG. 8. shows schematically the wafer of FIG. 7 after further processing.

At 108, the donor wafer 112 and thick BOX layer 114 are removed to leave a thin SOI layer 116 on thin BOX 118 on buried stressor 120, as shown in FIG. 8. A major portion of the bulk donor wafer may be split off by any conventional splitting or exfoliation technique, such as the SmartCut process, leaving a minor portion of the bulk donor wafer 112 attached to the thick BOX layer 114. Thereafter, the remaining portion of the bulk donor wafer may be removed by a conventional selective dry or wet chemical etch, leaving the thick BOX layer 114 exposed. The thick BOX layer 114 may be removed using a conventional selective dry or wet chemical etch, leaving the ultra-thin SOI layer 116 exposed.

Thus, various semiconductor structures and methods for making same have been described. In some of the above-described embodiments, certain process sequences have been specified. However, in other embodiments, the order of steps in these sequences may be altered without departing from the present invention. For example, in some instances of the invention, trenches may be etched before a nitride hard mask is softened. Also, lithographic and etch processes to define and create active widths and active lengths may, in general, be performed in either order.

What is claimed is:

1. A method for forming a semiconductor structure with a buried stressor (BS) layer having a bonding layer (BL) at its surface. the method comprising:
   forming the BS layer on a substrate of a first wafer, wherein the BS layer is silicon germanium and the substrate of the first wafer is silicon or a semiconductor alloy containing silicon and the BS layer is grown epitaxially on the substrate of the first wafer to a thickness less than a critical thickness at which misfit dislocations are generated;
   growing the BL at the surface of the BS layer; and
   wafer bonding the first wafer to a second wafer having a silicon oxide layer formed on a silicon substrate such that the silicon oxide layer of the second wafer is bonded to the BL layer of the first wafer.

2. The method of claim 1, wherein the BS layer is grown to a thickness in the range 5 nm to 70 nm.

3. The method of claim 1, further comprising annealing the semiconductor structure after wafer bonding the first wafer to the second wafer.

4. The method of claim 1, wherein the BL is formed by epitaxial growth on top of the BS layer, and is grown to approximately one or two nm thick.

5. The method of claim 1, wherein the silicon oxide layer of the second wafer is formed on the silicon substrate of the second layer to a thickness in the range 5 nm to 80 nm.

6. The method of claim 1, further comprising, after wafer bonding the first wafer to the second wafer, transforming the BL layer by subjecting the semiconductor structure to one or more high temperature processes to cause germanium in the silicon germanium BS layer to diffuse orthogonally, or approximately so, to a plane of the BS layer, effectively extending the silicon germanium BS layer to the silicon oxide layer.

7. The method of claim 4, further comprising, after wafer bonding the first wafer to the second wafer, transforming the BL layer by subjecting the semiconductor structure to one or more high temperature processes to cause germanium in the silicon germanium BS layer to diffuse orthogonally, or approximately so, to a plane of the BS layer, effectively extending the silicon germanium BS layer to the silicon oxide layer.

8. The method of claim 5, further comprising, after wafer bonding the first wafer to the second wafer, transforming the BL layer by subjecting the semiconductor structure to one or more high temperature processes to cause germanium in the silicon germanium BS layer to diffuse orthogonally, or approximately so, to a plane of the BS layer, effectively extending the silicon germanium BS layer to the silicon oxide layer.

9. A method for forming a semiconductor structure with a buried stressor (BS) layer having a bonding layer (BL) at its surface, the method comprising:
   forming the BS layer on a substrate of a first wafer, wherein the BS layer is silicon germanium and the substrate of the first wafer is silicon or a semiconductor alloy containing silicon and the BS layer is grown epitaxially on the substrate of the first wafer:
   growing the BL at the surface of the BS layer, wherein the BL is formed by epitaxial growth on top of the BS layer and is grown to a monolayer thick; and
   wafer bonding the first wafer to a second wafer having a silicon oxide layer formed on a silicon substrate such that the silicon oxide layer of the second wafer is bonded to the BL layer of the first wafer.

10. The method of claim 9, wherein the BL is grown to approximately one or two nm thick.

11. The method of claim 9, wherein the silicon oxide layer of the second wafer is formed on the silicon substrate of the second layer to a thickness in the range 5 nm to 80 nm.

12. A method for forming a semiconductor structure with a buried stressor (BS) layer having a bonding layer (BL) at its surface, the method comprising:
   forming the BS layer on a substrate of a first wafer, wherein the BS layer is a silicon germanium layer having a non-uniform germanium concentration profile within the thickness of the BS layer;
   growing the BL at the surface of the BS layer; and
   wafer bonding the first wafer to a second wafer having a silicon oxide layer formed on a silicon substrate such that the silicon oxide layer of the second wafer is bonded to the BL layer of the first wafer.

13. A method for forming a semiconductor structure with a buried stressor (BS) layer having a bonding layer (BL) at its surface, the method comprising:
   forming the BS layer on a substrate of a first wafer;
   growing the BL at the surface of the BS layer;
   wafer bonding the first wafer to a second wafer having a silicon oxide layer formed on a silicon substrate such that the silicon oxide layer of the second wafer is bonded to the BL layer of the first wafer: and
   removing a majority of thickness of the substrate of the second wafer, leaving a layer of silicon having a thickness in the range 0.2 nm to 50 nm remaining on the silicon oxide layer, and the silicon oxide layer bonded to the BL layer above the BS layer of the first wafer.

14. The method of claim 13, wherein the BS layer is silicon germanium and the substrate of the first wafer is silicon or a semiconductor alloy containing silicon, and the BS layer is grown epitaxially on the substrate of the first wafer.

15. The method of claim 14, further comprising patterning the semiconductor structure and etching trenches therein such that the trenches are of a depth sufficient to pass through the silicon oxide, BL, and BS layer and into the substrate of the first wafer, and filling the trenches with an oxide.

16. The method of claim 13, further comprising, after wafer bonding the first wafer to the second wafer, transforming the BL layer by subjecting the semiconductor structure to one or more high temperature processes to cause germanium in the silicon germanium BS layer to diffuse orthogonally, or approximately so, to a plane of the BS layer, effectively extending the silicon germanium BS layer to the silicon oxide layer.

17. The method of claim 14, further comprising, after wafer bonding the first wafer to the second wafer, transforming the BL layer by subjecting the semiconductor structure to one or more high temperature processes to cause germanium in the silicon germanium BS layer to diffuse orthogonally, or approximately so, to a plane of the BS layer, effectively extending the silicon germanium BS layer to the silicon oxide layer.

18. The method of claim 15, further comprising, after wafer bonding the first wafer to the second wafer, transforming the BL layer by subjecting the semiconductor structure to one or more high temperature processes to cause germanium in the silicon germanium BS layer to diffuse orthogonally, or approximately so, to a plane of the BS layer, effectively extending the silicon germanium BS layer to the silicon oxide layer.

19. The method of claim 15, further comprising, after etching the trenches, subjecting the semiconductor structure to a thermal process having a duration of between 1 millisecond and 60 seconds and reaching a maximum temperature of between 600 C and 1200 C, wherein the thermal process is a rapid thermal annealing (RTA) process, a flash lamp annealing process, a laser annealing process, or another rapid heating process.

20. A method for forming a semiconductor structure with a buried stressor (BS) layer having a bonding layer (BL) at its surface, the method comprising:
    forming the BS layer on a substrate of a first wafer, wherein the BS layer comprises silicon germanium grown epitaxially on the first wafer, and a composition of the silicon germanium within the BS layer varies with depth;
    growing the BL at the surface of the BS layer; and
    wafer bonding the first wafer to a second wafer having a silicon oxide layer formed on a silicon substrate such that the silicon oxide layer of the second wafer is bonded to the BL layer of the first wafer.

21. The method of claim 20, wherein the BL comprises silicon.

22. The method of claim 20, further comprising exfoliating a layer of the silicon substrate of the second wafer adjacent the silicon oxide layer to form a semiconductor-on-insulator (SOI) structure with the BS layer underlying a buried oxide (BOX) layer.

23. The method of claim 22, wherein the composition of the silicon germanium within the BS layer varies from a low fraction of germanium of less than 50% near an interface of the BS layer and the first wafer, to a high fraction of germanium of approximately 50% or more at a top surface of the BS layer.

24. The method of claim 23, wherein a total thickness of the BS layer is in the range 5 nm to 70 nm.

25. The method of claim 23, wherein the variation of the composition of the silicon germanium within the BS layer is non-linear.

26. The method of claim 25, wherein a total thickness of the BS layer is in the range 5 nm to 70 nm.

27. The method of claim 23, further comprising applying a high temperature process to the SOI structure with the BS layer underlying the BOX layer to diffuse germanium from the BS layer into the BL.

28. The method of claim 22, further comprising, after wafer bonding the first wafer to the second wafer, transforming the BL layer by subjecting the semiconductor structure to one or more high temperature processes to cause germanium in the silicon germanium BS layer to diffuse orthogonally, or approximately so, to a plane of the BS layer, effectively extending the silicon germanium BS layer to the silicon oxide layer.

29. The method of claim 23, further comprising, after wafer bonding the first wafer to the second wafer, transforming the BL layer by subjecting the semiconductor structure to one or more high temperature processes to cause germanium in the silicon germanium BS layer to diffuse orthogonally, or approximately so, to a plane of the BS layer, effectively extending the silicon germanium BS layer to the silicon oxide layer.

* * * * *